United States Patent [19]

Johnson, Jr.

[11] 4,215,430
[45] Jul. 29, 1980

[54] FAST SYNCHRONIZATION CIRCUIT FOR PHASE LOCKED LOOPED DECODER

[75] Inventor: Allan L. Johnson, Jr., Wayzata, Minn.

[73] Assignee: Control Data Corporation, Minneapolis, Minn.

[21] Appl. No.: 945,990

[22] Filed: Sep. 26, 1978

[51] Int. Cl.² .......................... H04L 7/04; H03D 3/24
[52] U.S. Cl. .................................. 375/111; 375/120; 360/51
[58] Field of Search ................ 178/69.1, 67; 328/133, 328/72, 74, 134; 329/50, 122, 124; 331/1 A, 25, 27; 340/146.1 D; 307/232; 360/51

[56] References Cited

U.S. PATENT DOCUMENTS

| | | | |
|---|---|---|---|
| 3,337,747 | 4/1967 | Krasnick et al. | 178/69.1 |
| 3,593,044 | 7/1971 | McNeilly | 178/69.1 |
| 3,731,220 | 5/1973 | Besenfelder | 331/1 A |
| 3,755,747 | 8/1973 | Letosky | 307/232 |
| 3,939,438 | 2/1976 | Taylor | 331/1 A |
| 3,944,940 | 3/1976 | Desai | 329/50 |
| 4,055,814 | 10/1977 | Abraham et al. | 331/1 A |
| 4,085,288 | 4/1978 | Viswanatham | 178/69.1 |
| 4,155,045 | 5/1979 | Forsberg | 307/232 |

*Primary Examiner*—Benedict V. Safourek
*Attorney, Agent, or Firm*—Frederick W. Niebuhr

[57] ABSTRACT

A phase detector in a phase locked loop decoder includes a reactive circuit adapted to vary a clock frequency responsive to a signal representing the phase error between a clocking signal and an incoming data signal, to maintain synchronization of the clocking and data signals. A fast synchronization circuit of the phase detector is adapted to generate a clock-frequency-altering signal whenever selected inputs derived from the data and clocking signals occur simultaneously, thereby rapidly forcing the clocking signal toward synchronization with the data signal.

12 Claims, 8 Drawings Figures

FAST SYNCHRONIZATION CIRCUIT FOR PHASE LOCKED LOOPED DECODER

BACKGROUND OF THE INVENTION

Data is stored on magnetic tape in one or more parallel tracks, each track including a series of fixed magnetization areas between which areas occur magnetic flux transitions. Each track can be divided into discreet segments or "bit cells" wherein a magnetic flux transition may or may not occur.

The occurrence or non-occurrence of a flux transition within a cell is converted into binary electronic data via any one of a number of codes provided therefore. For example, with non-return-to-zero input (NRZI) encoding, a flux transition within a bit cell causes a switching from one of two discrete voltage levels (e.g., high and low) to the other, indicating a logical "one". The non-occurrence of a transition within a bit cell results in no switching, indicating a logical "zero". Another example of the "double frequency" code which causes a switching coincident with a logical one, between consecutive zeros, and between each one and zero, but not between two consecutive ones.

Efforts to increase the speed at which data can be placed in storage, retrieved and transmitted, has led to increased data density, i.e., more bit cells per unit length of tape. The increased bit density or bit crowding can cause bit shift, or the reading of magnetic flux transition off-center within their respective bit cells or even outside the cells. The effect of bit shift can be a phase drift or loss of synchronization between an incoming data signal and a clock signal. Further synchronization difficulties arise from mechanical speed variations or in "fishtailing" of the tape. As data density is increased, the problems become more pronounced. One approach to reducing phase drift is group code recording (GCR) or run-length-limited coding, wherein the number of consecutive zeros is limited. For example, U.S. Pat. No. 3,566,351 to Sekse et al granted Feb. 23, 1971 discloses a data transmission system in which each switching between zero and one resynchronizes a receiving oscillator to a transmitting oscillator. To avoid excessive drift between oscillators, characters are written in a code permitting in each character a maximum of two consecutive zeros or ones, insuring that a data word will contain at most four consecutive zeros or ones. U.S. Pat. No. 3,852,687 to Hodges granted Dec. 3, 1974 shows an improvement of the modified frequency modulation (MFM) method whereby the number of clock periods for an eight bit byte is reduced from 16 to 13, thereby increasing density of data for a given magnetic switching density.

One known method of maintaining synchronization between incoming data signals and clock signals, despite some bit shift, is the use of a phase locked oscillator. A phase comparator determines the shift in phase between the input data signal and the output from a voltage controlled oscillator (VCO) used to drive a clock. Based on the phase difference between clock and data, a signal is generated to increase or decrease voltage to the VCO thereby tending to resynchronize the clock with the incoming signal. By combining the VCO with a frequency multiplier and including it in a phase locked loop with a counter dividing the frequency by the same number, e.g., 5, the maximum possible error can be reduced from pi radians to pi/5 radians. Such an improvement is shown in U.S. Pat. No. 4,005,479 to Hunnicutt, granted Jan. 25, 1977 and assigned to the assignee herein.

Disadvantages associated with the use of a voltage controlled oscillator included variations in frequency caused by temperature and component value drift. As frequency changes, the loop tends to unlock and may even oscillate or hunt around a new frequency. To avoid these disadvantages, U.S. Pat. No. 3,973,209 granted to Nossen et al on Aug. 3, 1976 discloses a closed loop which replaces the VCO with a variable register 13 and a fixed register 16. The value stored in fixed register 16 is representative of the nominal frequency, while the numbers stored in variable register 13 represent the Doppler or variation from the base or nominal frequency.

Another method for insuring synchronization of data is by provision of a synchronizing word or marker bit. In U.S. Pat. No. 3,576,947 to Kruger granted May 4, 1971, each 240 bit frame includes a sync word or its complement. By processing either the sync word or complement thorugh a shift register and aligning the sync word or complement from the adjoining frame, frames of different data streams can by synchronized. U.S. Pat. No. 3,789,400 to Towns granted Jan. 29, 1974 shows an apparatus for correcting the skewing of data caused by fishtailing of magnetic tape. Data recorded on separate tracks is led by a marker bit in each track. The marker bits are moved through a shift register to an "AND" gate. When the marker bits from all tracks reach the AND gate it is enabled so that data from all tracks are read simultaneously.

SUMMARY OF THE INVENTION

This invention relates to an apparatus and method for receiving a data signal and processing the data signal using a clocking signal, the frequency of which depends upon a clocking voltage. The apparatus includes a phase detector for generating an output to control the clocking voltage and thus control the clocking signal frequency.

The phase detector includes coincidence circuitry to which the following input signals are provided: a preamble input active during the preamble portion of the data signal; first and second data inputs each derived from the data and clocking signals; and first and second timing inputs each derived solely from the clocking signal. Based upon these inputs, the coincidence circuitry generates first and second phase detector output signals, herein respectively fast sync pump up and fast sync pump down signals. The pulse width of the fast sync pump up signal depends upon the length of time that the preamble, first timing, and first data inputs are simultaneously received. The fast sync pump down signal has a pulse width dependent upon the length of time that the preamble, second timing and second data inputs are high. The phase detector output signals control the clocking voltage and clocking frequency. In response to a phase error between the data and clocking signals, the phase detector is thus adapted to alter the clocking frequency toward synchronization with the data signal.

As shown, the coincidence circuitry is advantageously combined with reactive circuitry having, as inputs, the first data input and third and fourth timing inputs derived from the clocking signal. The reactive circuitry generates a tracking pump up signal having a pulse width dependent upon the length of time the first data and third timing inputs are high, and a tracking pump down signal having a pulse width dependent upon the amount of time that the first data and fourth timing inputs are high. Using reactive and coincidence circuitry, clocking voltage depends upon the pulse widths of the fast sync and tracking signals.

By combining the coincidence and reactive circuitry, advantages of both can be utilized and disadvantes of both overcome. The coincidence system has a wide capture range and does not lock on harmonics. However, it lacks the ability to ride through zeros in the (GCR) waveform. A "zero" cannot be distinguished from a late "one," erroneously reducing the VCO frequency. The reactive system is able to track the GCR waveform and ride through zeros, and further is highly stable at synchronization, but can lock on harmonics. Thus the circuitry combination has a wide capture range, avoids locking on harmonics during synchronization, yet successfully rides through zeros and loss of data signal.

IN THE DRAWINGS

DETALILED DESCRIPTION OF THE PREFERRED EMBODIMENT

Figure 1:
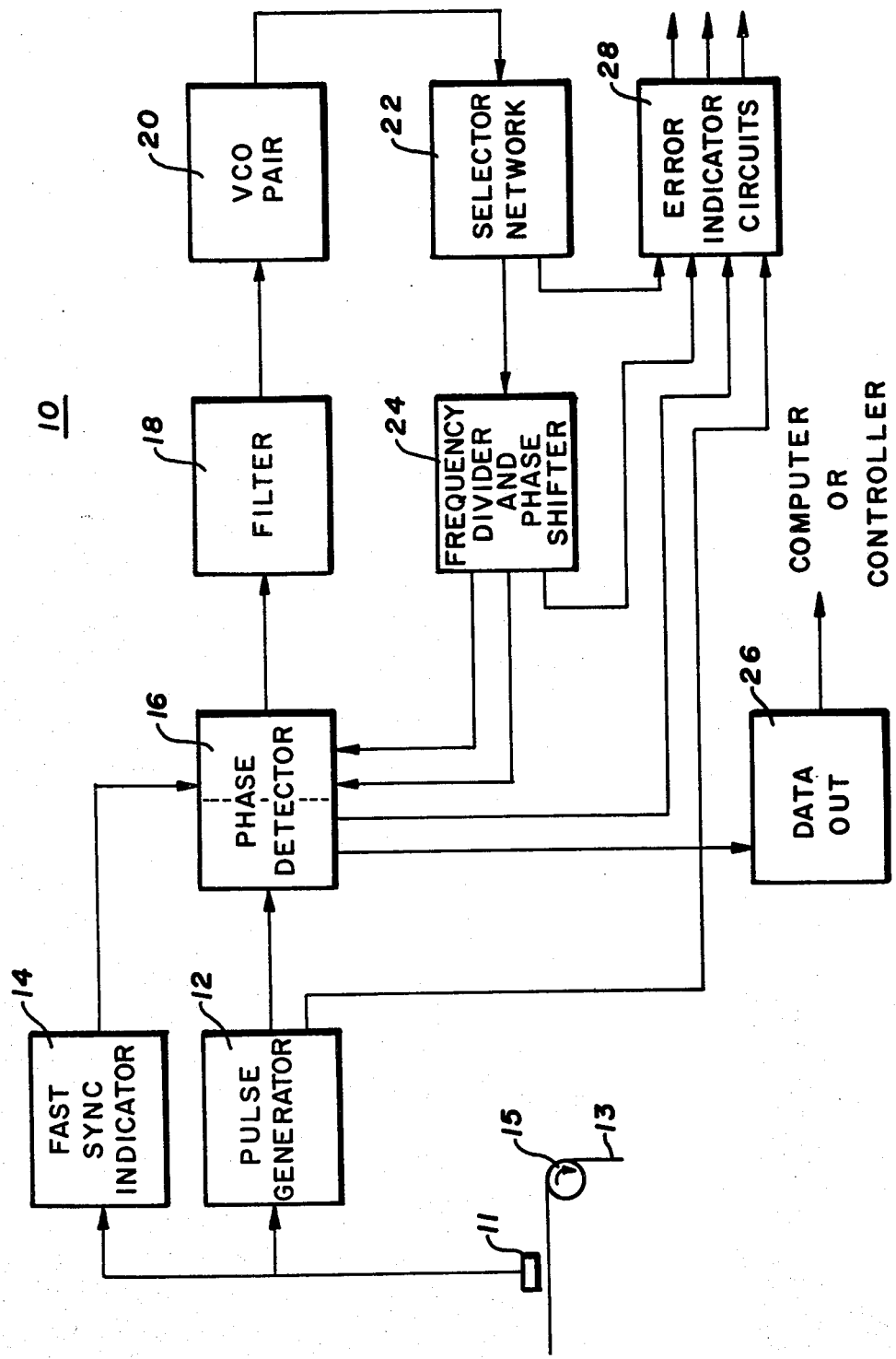
FIG. 1 is a block diagram of a data discriminator constructed in accordance with the presently preferred embodiment of the invention.

Referring to the drawings, there is shown in FIG. 1 a data discriminator generally at 10, adapted for receiving a data signal or waveform and processing the data signal using a clocking signal. A pulse generator 12 and a fast synchronization indicator 14 receive a group code recording (GCR) data waveform directly from a magnetic read head or transducer 11 and its accompanying circuitry (not shown). The GCR data is a coded non-return-to-zero (NRZ) waveform generated by magnetic flux transitions along the surface of magnetic tape such as that shown at 13. A drive capstan 15 moves tape 13 at a substantially contrant speed relative to transducer 11. A flux transition occurs at each logical "one" while no flux transition occurs at each logical "zero." Each flux transition causes an electrical switching between high and low voltage levels. To form the GCR input, the NRZ input is converted into a code which insures that no more than two zeros occur serially. While GCR data is the exemplary form used in this embodiment, it is understood that the invention is readily adapted for use in connection with other codes, for example, MFM, double frequency and phase encoding.

Fast sync indicator 14 is active only during the preamble of the data record, that is, the leading portion of a data record containing a series of consecutive "ones" and distinguishable from data by a selected code occurring just prior to data. A counter (not shown) counts flux transitions and disables the indicator approximately at the end of the first half of the preamble. Pulse generator 12, to the contrary, is active throughout the data record. The output of pulse generator 12 is a narrow, high-going pulse whenever there is a flux transition.

Figure 2A:
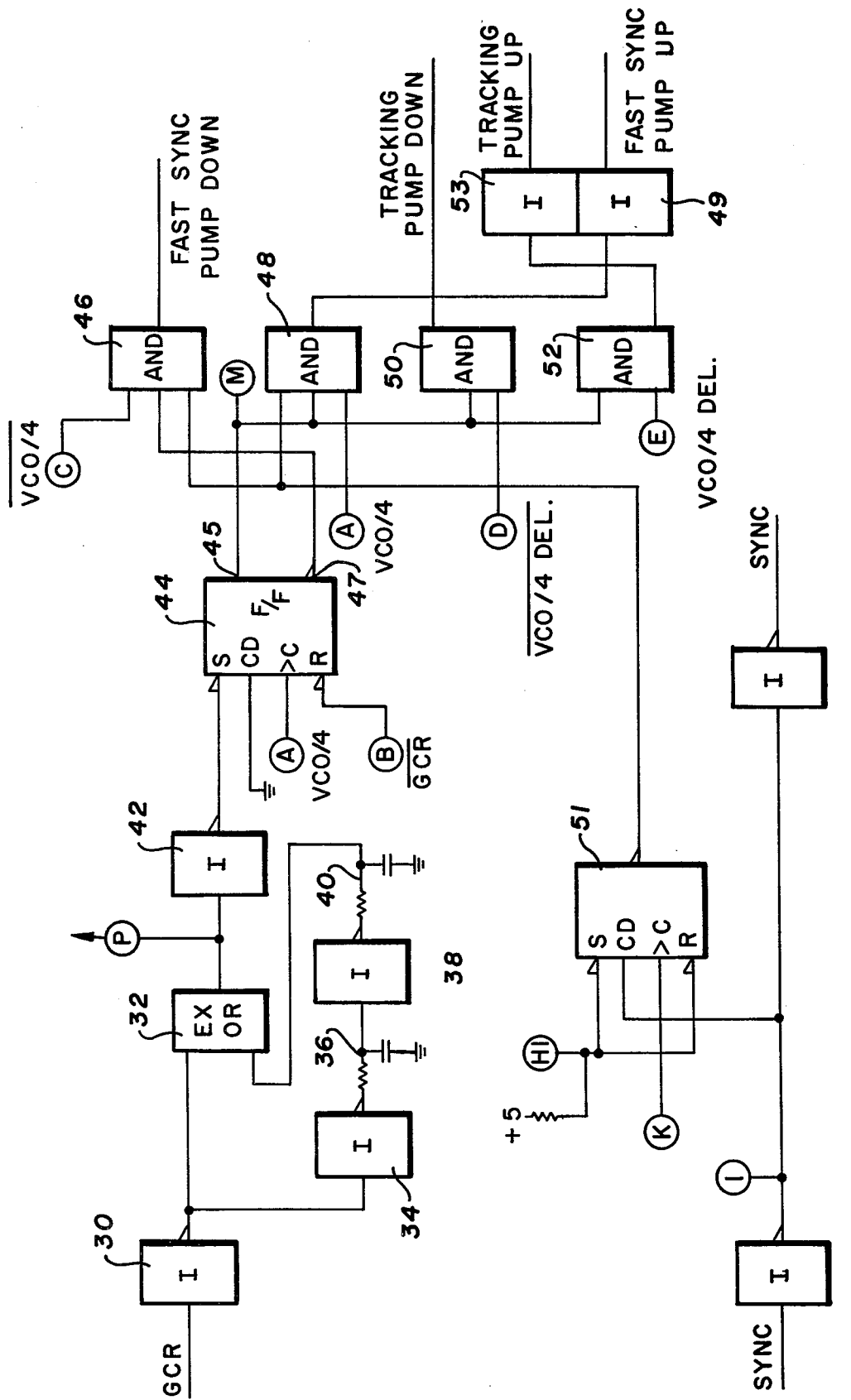
FIGS. 2A-2C are more detailed diagrams of the discriminator of FIG. 1.

Output of pulse generator 12 and indicator 14 is fed to a phase locked loop including a phase detector 16, a filter 18, a voltage controlled oscillator pair or VCO 20, a selector network 22, and a frequency divider and phase shifter 24. As will be explained in connection with FIG. 2, the output of phase detector 16 is a function of the phase difference between clocking signals generated by VCO 20 and incoming data. Filter 18 converts the phase detector output to a voltage level supplied to VCO pair 20, which voltage level can either increase or decrease VCO frequency.

VCO pair 20 is operable at three bit cell widths, corresponding to three tape speeds: 200 ips, 150 ips and 100 ips. The same VCO is used for both of the 100 ips and 200 ips speeds. Selector network 22 determines which VCO of VCO pair 20 is utilized.

The VCO signal is divided by two, twice, to generate a signal having one-forth the frequency of the VCO. The VCO/4 signal is phase shifted or delyaed pi/2 radians. The VCO/4 and VCO/4 delayed signals are inverted. These four signals; VCO/4, $\overline{VCO/4}$ (VCO/4 inverse), VCO/4 delayed, and $\overline{VCO/4}$ delayed, determine the output of phase detector 16, provided the clocking signal for a data decoder 26, and provided input to error indicator circuits 28.

Figure 2B:
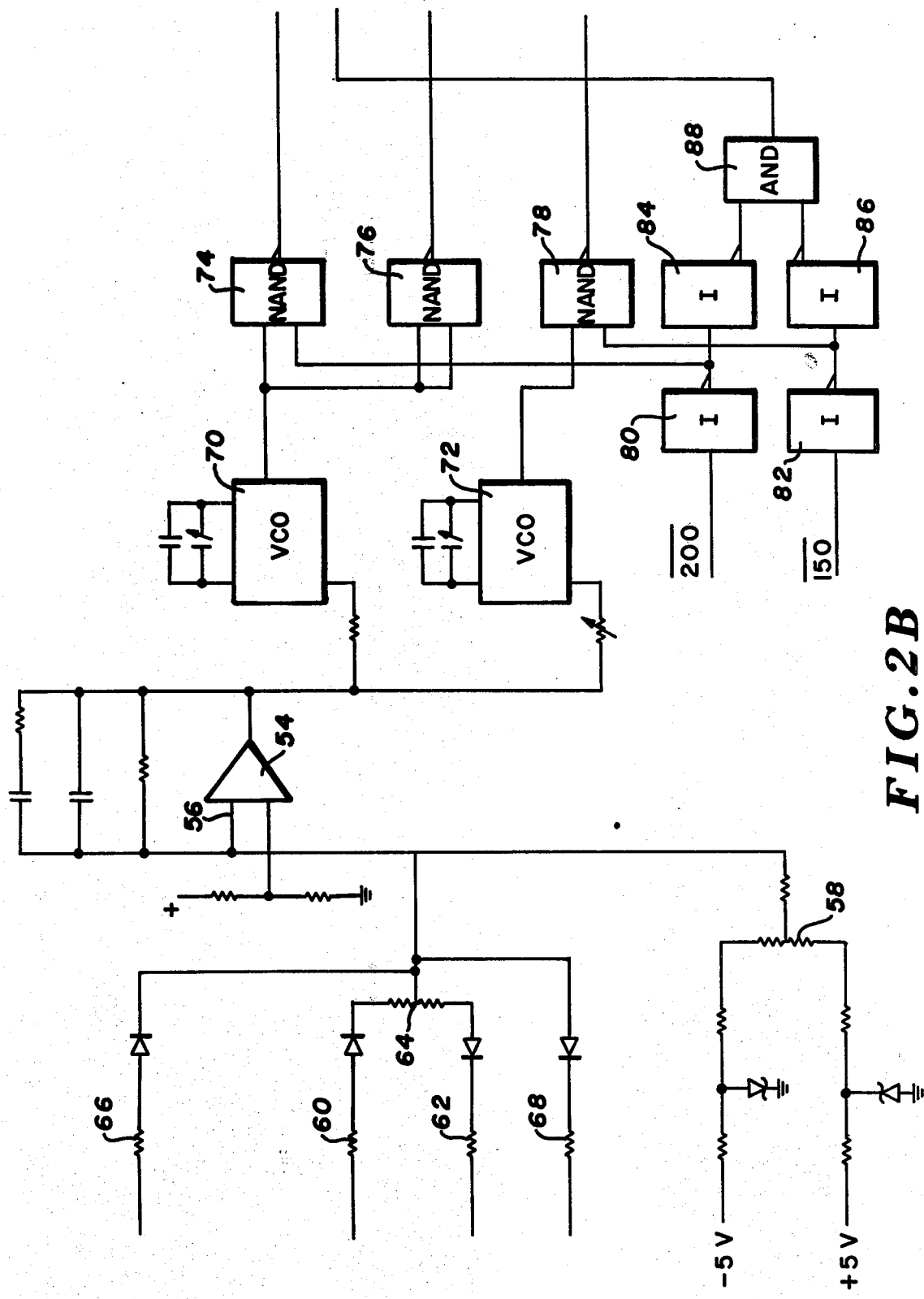
Figure 2C:
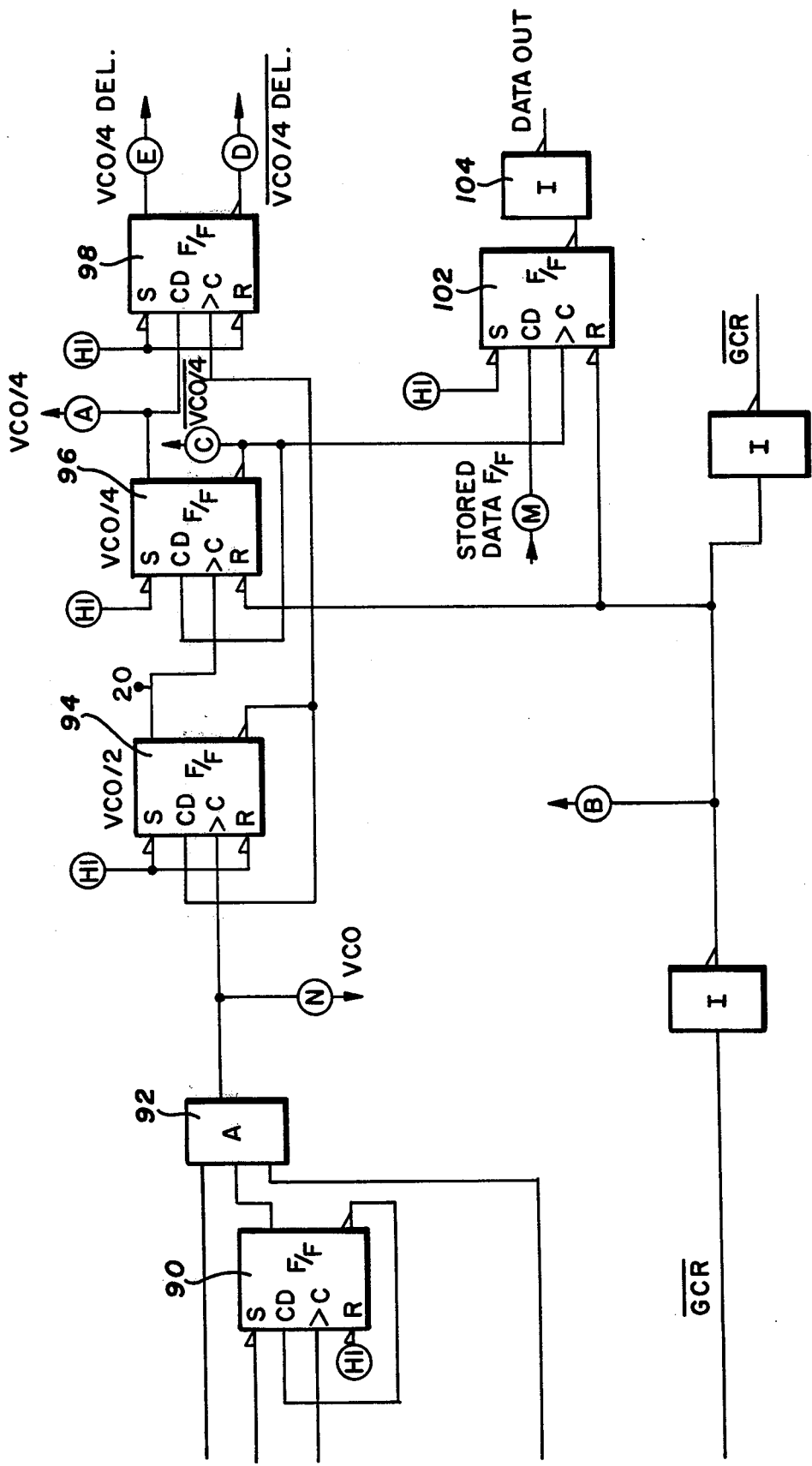

FIG. 2 is a schematic diagram of discriminator 10 in greater detail. FIG. 2 will be described in conjunction with FIG. 4 which illustrates the timing of the system in connection with the GCR waveform from the read head circuitry representing the data 111101001. For each logical "one," a transition occurs between high and the low voltage levels. For a logical "zero" no voltage transition occurs.

Figure 4:
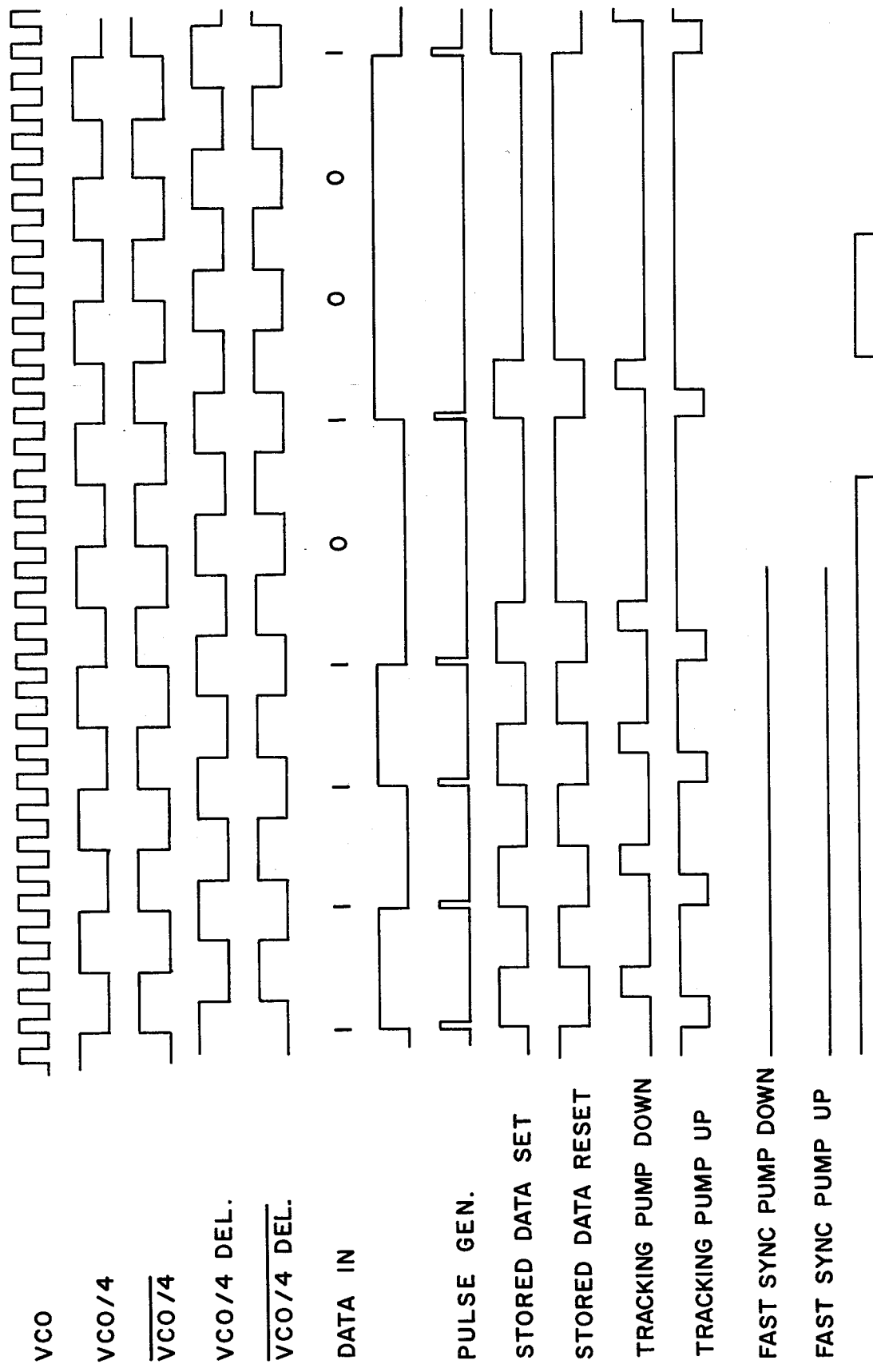
FIG. 4 is a timing diagram showing the discriminator in synchronization.

Prior to entering phase generator 12, the GCR signal is inverted by a first inverter 30, to reduce loading on the data line and to buffer Schottky inputs. The inverted signal is fed directly to one input terminal of the Exclusive OR gate 32, and supplied to the other input of Exclusive OR gate 32 through two delay circuits, one including a first pulse generator inverter 34 and first RC delay 36, the other including a second pulse generator inverter 38 and second RC dealy 40. Two delay circuits are provided to insure that the output of pulse generator 12 is of the same width for a transition from high to low voltage as for a transition from low to high voltage. As seen in FIG. 4, pulse generator output is a narrow, high going pulse for each transition of input data. The pulse width can be, for example, 30 nanoseconds, wide enough to reset a "no data" counter (to be later described) yet sufficiently narrow to avoid resetting a "stored data" flip-flop 44 immediately after the same has been cleared. It is preferred that OR gate 32, and inverters 34 and 38 be Schottky type or comparable quality.

From pulse generator 12, the signal is fed through an inverter 42 to phase detector 16 and specifically to the "set" terminal of stored data flip-flop 44. Flip-flop 44 is a bi-stable multivibrator capable of two stable states; a "set" state wherein the output at a set terminal 45 is high and the output at a reset terminal 47 is low, and a reset state wherein the output at terminal 45 is low and the output at terminal 47 is high. The set and reset states are derived from the data and clocking signals as follows: each 30-nanosecond pulse sets flip-flop 44 while a high input from a VCO/4 signal, a function of the clocking signal to be later explained, reset the flip-flop. The set output at terminal 45 is shown in FIG. 4, while the reset waveform at 47 is the direct inverse of the set output.

The set and reset output of flip-flop 44 comprise, respectively, first and second data inputs to coincidence circuitry and reactive circuitry within phase detector 16. VCO/4 and $\overline{VCO/4}$, derived from the clocking signal, comprise first and second timing inputs to the coincidence circuitry which includes a first detector AND gate 46, a second detector AND gate 48 and a first detector inverter 49. Each AND gate generates a high voltage signal only when the voltages of all input signals are high. For example, when the signal from a fast sync indicator flip-flop 51 (fast sync), reset, and $\overline{VCO/4}$ all are high, then the output of AND gate 46 is high. Otherwise it is low. Likewise, the output of AND gate 48 is high (and that of inverter 49 low) only when fast sync, VCO/4 and set are high. The output of AND gate 46 comprises a first phase detector output called a fast sync pump down signal. The output of inverter 49 is a second phase detector output, called a fast sync pump up signal.

The reactive circuitry includes a third detector AND gate 50, a fourth detector AND 52 and a second detector inverter 53. Inputs to the reactive circuitry, in addition to the set of first data input, are a third timing input (VCO/4 delayed) and a fourth timing input ($\overline{VCO/4}$ delayed), both derived from the clocking signal. The output of AND gate 50, a third phase detector output called the tracking pump down signal, is high only when set and $\overline{VCO/4}$ del. are high. Accordingly, the output of inverter 53, a fourth phase detector output called the tracking pump up signal, is low only when set and VCO/4 del. are high.

Each phase detector output has a selected or fixed pulse width when the data signal and clocking signal are synchronized. At synchronization (FIG. 4) the pulse width of both fast sync signals is zero, and the tracking signals have oppositely directed pulses equal to zero when associated with a logical zero, and equal to twice the VCO pulse width when associated with a logical one. As will be later explained, deviations from synchronization change the pulse of at least one of the phase detector outputs to a width other than its selected value, which in turn alters the voltage supplied to VCO 20.

Active filter 18 functions as a voltage generator and comprises the means through which the phase detector outputs control the voltage supplied to VCO pair 20. Filter 18 includes an operational amplifier 54 voltage-biased at its positive terminal. Inputs to its negative terminal 56 include feedback current, a direct bias current, and a tuning current determined by the phase detector outputs. The bias current can be controlled by an adjustable resistor 58 and is set to produce a fixed output from amplifier 54, for example 3.90 volts. The tuning current portion generated by the tracking pump up and pump down pulses is determined by a first resistor 60, a second resistor 62, and a variable resistor 64. The portion of tuning current generated by the fast sync signals is determined by third and fourth resistors 66 and 68. Once variable resister 64 is set, the tuning current to amplifier 54 is a direct function of the pulse widths of the phase detector outputs. Filter output is thus a fixed voltage at synchronization, deviation from the fixed voltage occurring in response to deviation in phase detector output pulse widths from their selected values.

Voltage control oscillator pair 20 includes a first VCO chip 70 adapted for use with a tape speed of either 200 or 100 inches per second, and a second VCO chip 72 adapted for use when the tape speed is 150 ips. While it would be possible to use only one chip, use of two chips is preferred for avoiding interaction between the 150 ips and 100/200 ips circuitry. In the absence of input data, each VCO chip input is biased to the fixed amplifier output of 3.90 volts, the approximate center of the chip linear operating range. Each chip oscillates at frequency determined by the voltage supplied to it. Increased voltage results in higher frequency.

VCO chips 70 and 72 are connected to selector network 22 via back panel connectors. This connecting method facilitates PAK testing by isolating the oscillators from the digital logic of the selector network. Network 22 includes first, second and third "NAND" gates 74, 76 and 78, gate 74 having inputs from chip 70 and an auxiliary 200 ips select circuit, gate 76 having inputs from chip 70, and gate 78 receiving input from 150 VCO chip 72 and from an auxiliary 150 ips select circuit. NAND gates 74, 76 and 78 produce a high output whenever either or both of their respective inputs are low; and a low input when both of their respective inputs are high. A first network inverter 80 inverts the 200 ips auxiliary signal before its input into NAND gate 74. Likewise, a second network inverter 82 inverts the 150 ips auxiliary signal prior to its input into NAND gate 78. The 200 ips and 150 ips signals are reinverted by a third network inverter 84 and a fourth network inverter 86, respectively, prior to their input into a first network AND gate 88. The output of AND gate 88 is received at the set input terminal of a selector network flip-flop 90, which flip-flop also receives the output of NAND gate 76. Flip-flop 90 used with a tape speed of 100 ips, divides the signal of 200 ips VCO chip 70 by two. A second network AND gate 92 has inputs from NAND gate 74, flip-flop 90 and NAND gate 78. The output of AND gate 92, shown in FIG. 4, is the VCO output associated with the particular tape speed.

Frequency divider and phase shifter 24 includes a first divider flip-flop 94, second divider flip-flop 96 and a phase delay flip-flop 98. Flip-flop 94 divides the VCO signal by two. Second flip-flop 96 divides the output of flip-flop 94 by two, producing at its set terminal the signal VCO/4 (VCO frequency divided by four) and, at its reset terminal $\overline{VCO/4}$ (inverted VCO/4). As is seen from FIG. 2, $\overline{VCO/4}$ is used to clear stored data flip-flop 44 and further is the timing input to AND gate 48. The signal $\overline{VCO/4}$ is the timing input to AND gate 46 and is an input to data decoder 26. Phase delay flip-flop 98 delays the signal VCO/4 by pi/2 radians or 90 degrees to provide a set output of VCO/4 delayed. VCO/4 delayed is the timing input of AND gate 52 of phase detector 16. The reset output of flip-flop 98, $\overline{VCO/4}$ delayed, provides the timing input to AND gate 50.

Generally, phase detector 16 responds to a condition other than synchronization by generating at least one of its outputs at a pulse width other than its selected value. This changes the tuning current supplied to amplifier 54, which changes the voltage supplied to VCO 20, which in turn adjusts the VCO or clocking frequency toward synchronization with the incoming data signal.

The fast sync signals are inactive at synchronization. During the preamble, incoming data out of phase with the VCO produces pulses of variable width which diminish to zero at lock (synchronization). These pulses are formed in the fast sync pump down signal if the data signal lags the VCO, and in the fast sync pump up signal if data leads VCO.

The tracking signals also respond differently to non-synchronization depending upon whether data leads or lags VCO. Leading data causes stored data flip-flop 44 to set earlier than it would at lock, increasing the width of the tracking pump up signal while slightly decreasing the tracking pump down signal width. Lagging data sets flip-flop 44 later, narrowing tracking pump up pulses while tracking pump down pulse widths slightly increase.

Figure 5:
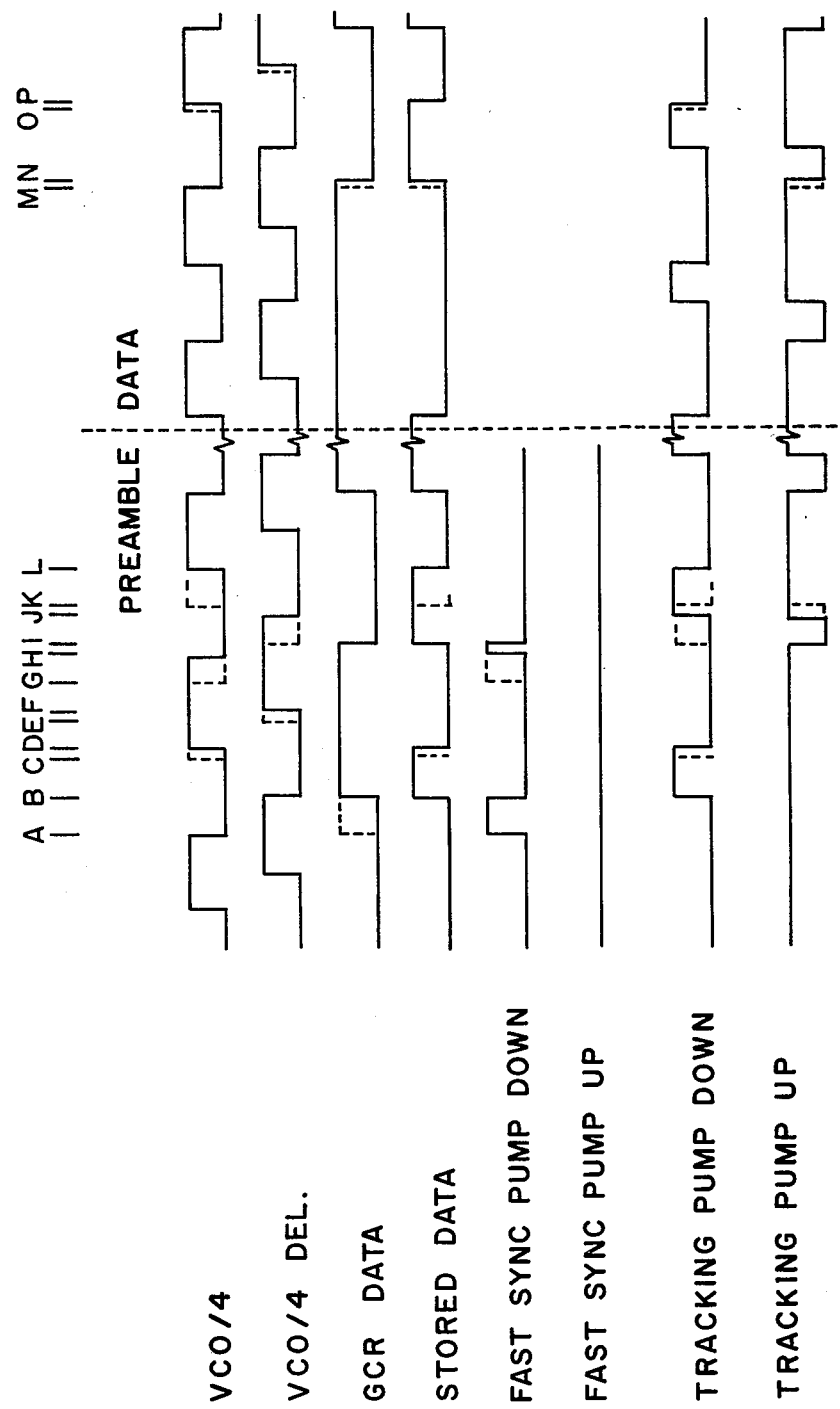
FIG. 5 is a timing diagram illustrating the operation of synchronization circuitry.

The timing diagrams in FIG. 5 illustrate phase error correction by the phase detector. The following wave forms are shown: VCO/4, VCO/4 delayed, GCR data, set (stored data flip-flop), fast sync pump down, fast sync pump up, tracking pump down and tracking pump up. A preamble of a data record is shown wherein the GCR data initially lags VCO/4 by 90 degrees. Thus, a transition in GCR occurs in vertical alignment with line B rather than with line A, where a transition would take place with the GCR data wave and clock in phase. Due to the phase error, the stored data flip-flop remains reset until line B. This, together with the fact that VCO/4 is low, causes the fast sync pump down signal to go high.

The fast sync pump down signal tends to decrease the frequency of the VCO clock. This is shown as an increase in the VCO/4 wave length, equal to the distance between vertical lines C and D. The increase or correction to VCO/4 delayed is shown as the distance between lines E and F. Because the VCO/4 signal goes high at D rather than C, the stored data flip-flop signal remains high for a greater length of time, represented by the distance between lines C and D. As stored data remains high, the tracking pump down signal also remains high, further reducing VCO frequency.

The distance between lines G and H represents the amount of correction in the VCO/4 signal as VCO approaches an in-phase relationship with GCR data. Because of the resetting of VCO/4 at line H, the fast sync pump down signal is high over only the narrow distance between the lines H and I. Thus, its corrective effect upon the VCO frequency is reduced as compared to the previous cycle.

Reflecting the correction of VCO/4 between lines G and H, VCO/4 delayed resets at line J rather than at line I. VCO/4, further corrected by the second fast sync pump down signal, a slightly wider than normal tracking pump down pulse and a narrower than normal pump up pulse, sets at line L rather than at line K. Also at line L, the VCO/4 signal for the first time sets in sync with GCR data. From then on, so long as VCO/4 and GCR remain synchronized, the fast pump down and fast pump up signals are inactive and the tracking pump up and tracking pump down signals are of equal width and oppositely directed for each logical one.

During the data phase, a situation is shown between lines M and N where GCR data lags VCO, due for example to downstream bit shift or an instantaneous deceleration in magnetic tape 13.

Because of the slight lag in GCR data, stored data flip-flop 44 sets at line N rather than line M. This narrows the tracking pump up signal, which is cut off as soon as VCO/4 delayed goes low. This narrowing tends to reduce the frequency (increase the wave length) of the VCO/4 signal, as shown by the distance between lines O and P. The later setting of VCO/4 slightly increases the width of the tracking pump down pulse, which also has the effect of decreasing the VCO frequency. Thus, it is seen that the corrective effects are initiated nearly instantaneously with the perceived phase error.

While a 90 degree phase lag in the preamble and a less than 90 degree lag during the data track are only two of many potential error situations, it is to be appreciated that the fast synchronization and tracking circuits operate similarly in other error situations.

Decoder 26 includes a data out flip-flop 102 and an inverter 104. Inputs to flip-flop 102 include a hi level signal to the set input, the output of stored data flip-flop 44, $\overline{VCO/4}$, and GCR to the reset input. For each cell of input data wave form, there is one high going clock pulse. If flip-flop 102 receives a high pulse while stored data flip-flop 44 is set, then flip-flop 102 is set to provide an output beyond inverter 104 of a logical one. A high pulse received while the stored data flip-flop is not set will result in a logical zero.

Figure 3:
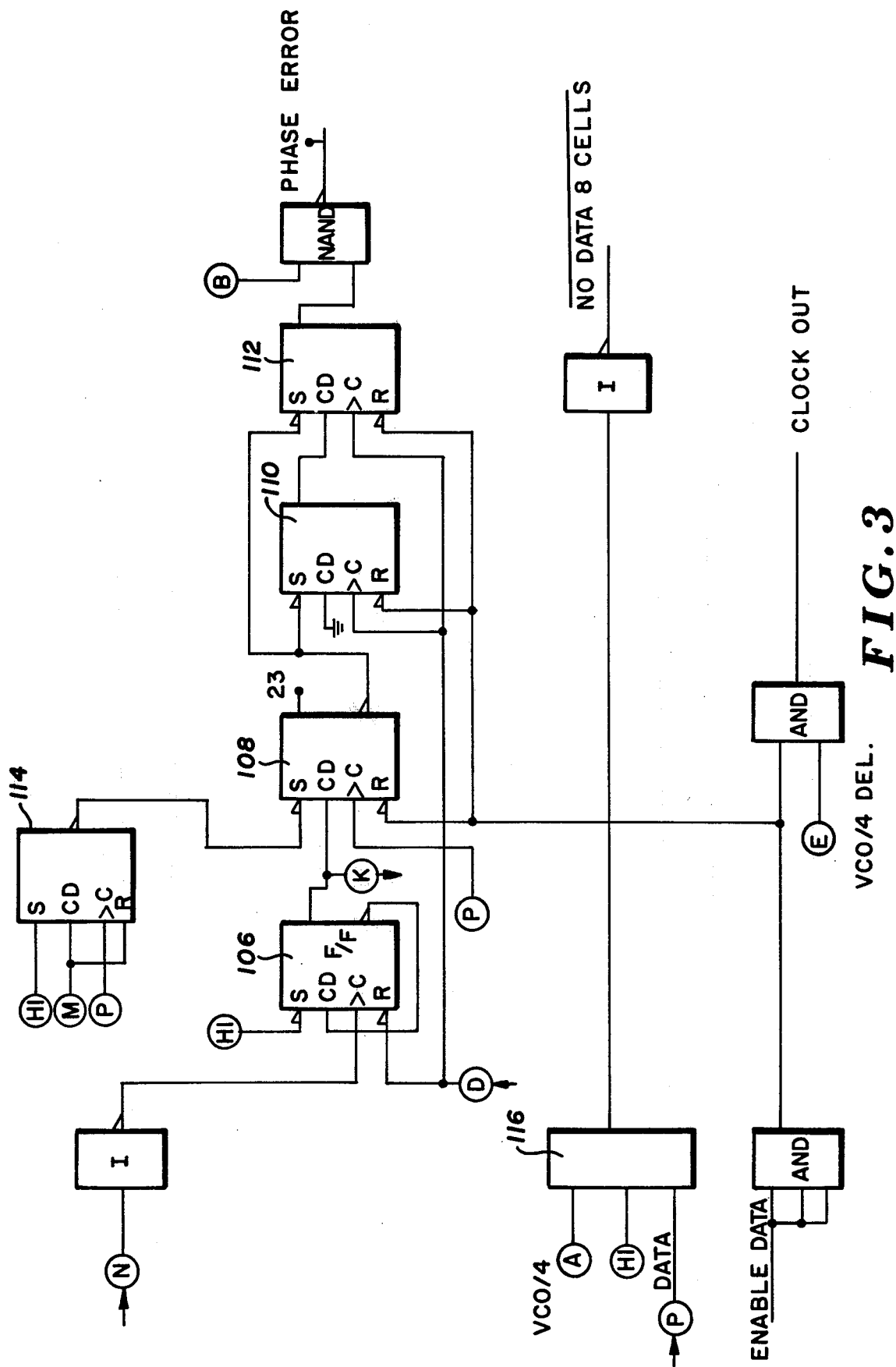
FIG. 3 is a detailed diagram associated with FIG. 2 showing error detection circuits used in the discriminator.

As shown in FIG. 3, means are provided to indicate errors which the phase detector adjustments to VCO are not adapted to correct. Three such errors can occur: occurrence of a data transition near a cell boundary rather than at its center; the occurence of two data transitions within one cell; and the loss of data.

Figure 6:
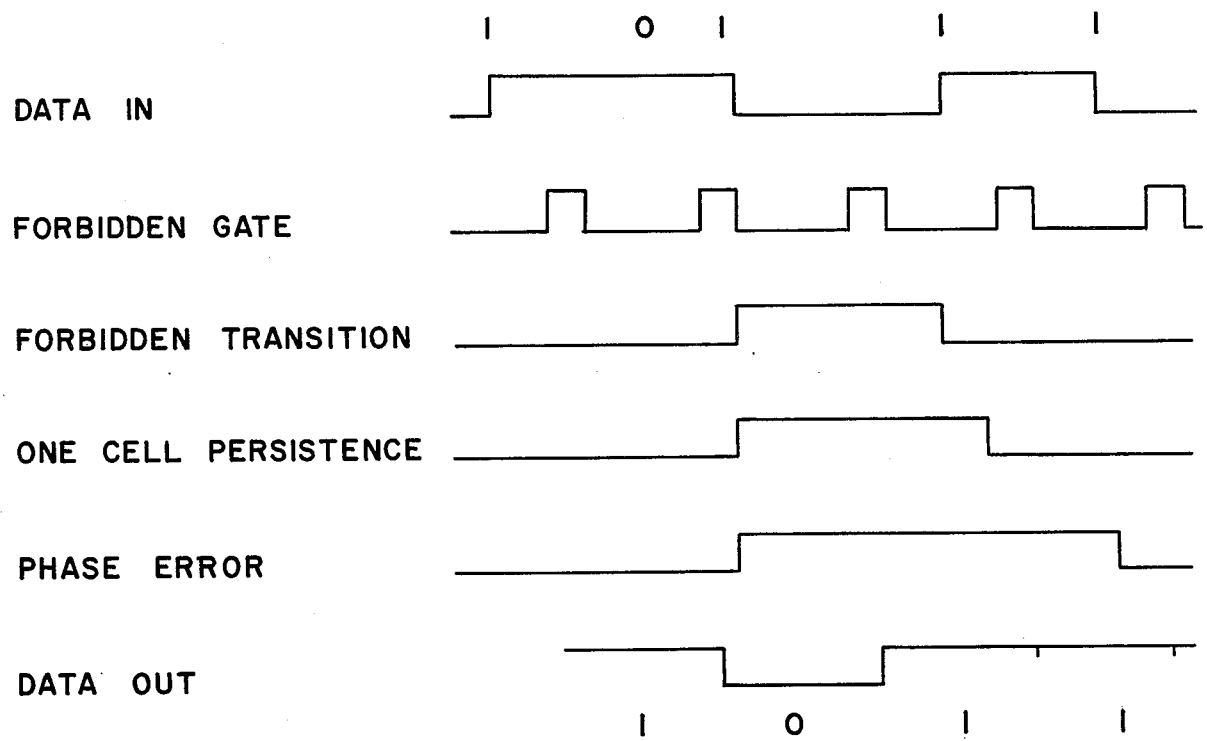
FIG. 6 is a timing diagram of error detection circuitry.

Circuitry for detecting an off-center data transition includes a forbidden gate flip-flop 106, a forbidden transition flip-flop 108, a one cell persistence flip-flop 110 and a phase error flip-flop 112. Inputs to forbidden gate flip-flop 106 include a hi level signal (preferably +5 volts as seen from FIG. 2A at flip-flop 51), VCO/4 delayed, and the VCO/clocking signal. As shown in FIG. 6, the set output of flip-flop 106 is high at the boundary between bit cells and for ⅛ of a bit cell width in both directions from the boundary. Otherwise the output is low, forming a permitted transition "window" ¾ of a bit cell in width and centered within the cell. The window location is seen in FIG. 6 from comparison of the vertically aligned waveforms for data-in and forbidden gate.

The data-in waveform is for a one followed by a zero, and then by a one located within its proper cell but close to the boundary, causing a transition outside of the permitted transition window. Occurrence of a transition while forbidden gate flip-flop 106 is high sets forbidden transition flip-flop 108, which in turn sets flip-flops 110 and 112.

The function of one cell persistence flip-flop 110 is shown with reference to the data out waveform. The setting of flip-flop 108 at the location shown indicates an error within either the bit cell containing the zero or the immediately following bit cell containing the one. Since it is uncertain which cell contains the error, the one cell persistence signal insures that an error is indicated for both cells and until a data transition occurs within the permitted transition window.

Means for detecting two transitions within one cell include flip-flops 108, 110, 112, and a double pulse flip-flop 114. Inputs to double pulse flip-flop 114 include a hi level signal, pulse generator output, and the set output of stored data flip-flop 44. Should a second data transition occur while stored data flip-flop 44 is set, double pulse flip-flop 114 is set. This sets forbidden transition flip-flop 108, which in turn sets flip-flops 110 and 112 to indicate a phase error.

A four bit counter chip 116 is provided to detect loss of data. Inputs to counter 116 include VCO/4, hi, and pulse generator output. The VCO/4 input is counted. Normally, input data will reset counter 116, but if no data input occurs for eight cells of VCO/4, a no data for eight cells signal indicates the data loss.

What is claimed is:

1. In data processing apparatus adapted to receive a data signal and to process the data signal using a clocking signal having a clocking frequency dependent upon a clocking voltage, said apparatus including a phase detector for generating an output to control said clocking voltage and thereby establish and maintain synchronization between said data and clocking signals, the improvement wherein:

said phase detector includes coincidence means having, as inputs, a preamble input active during the preamble of said data signal, first and second data inputs each derived from said data and clocking signals, wherein said second data input is the inverse of said first data input, and first and second timing inputs each derived solely from said clocking signal; said coincidence means generating a first phase detector output signal having a pulse width dependent upon the length of time during which said preamble, first data and first timing inputs are simultaneously high, and a second phase detector output signal having a pulse width dependent upon the length of time during which said preamble, second data and second timing inputs are simultaneously high;

wherein the pulse width of each phase detector output signal is a selected width whenever the data and clocking signals are synchronized; and wherein said phase detector, in response to a condition other than synchronization, generates at least one of said phase detector output signals at a pulse width other than its selected width to change said clocking voltage, the resulting change in clocking frequency tending to synchronize the clocking signal with said data signal.

2. The apparatus of claim 1 wherein:

the source of said data signal is a magnetizable tape moving at a substantially constant speed relative to a transducer and having thereon areas of magnetization, magnetic flux transitions between adjacent areas of magnetization causing electrical switching between a high voltage and a low voltage to generate said data signal.

3. The apparatus of claim 2 wherein:

means for generating said first timing input include dividing means for dividing the frequency of said clocking signal;

the means for generating said second timing input include said dividing means and inverting means whereby the second timing input is the inverse of said first timing input;

the means for generating said first data input includes a bi-stable multivibrator having as inputs said data signal and said first timing input, and having a set output forced into a high voltage whenever a data transition occurs, and forced into a low voltage whenever said first timing input switches from a low voltage to a high voltage, said set output comprising said first data input; and said second data input comprises a reset output of said multivibrator being the inverse of said set output.

4. The apparatus of claim 3 wherein:

said coincidence means includes a first AND gate having as inputs said preamble, first data and first timing inputs and having as its output said first phase detector output; a second AND gate having as inputs said preamble, second data and second timing inputs; and an inverter receiving the output of said second AND gate, the output of said inverter comprising said second phase detector output.

5. The apparatus of claim 4 including:

a second bi-stable multivibrator having as an input said first timing input, generating at a set output a third timing input comprising said first timing input delayed by pi/2 radians, and generating at a reset output a fourth timing input comprising the inverse of said third timing input;

said phase detector including reactive means having, as inputs, said first data input and said third and fourth timing inputs; said reactive means generating a third phase detector output signal having a pulse width dependent upon the length of time during which said first data and third timing inputs are simultaneously high, and a fourth phase detector output signal having a pulse width dependent upon the length of time during which said first data and fourth timing inputs are simultaneously high.

6. The aparatus of claim 5 wherein:

the pulses of said first and second phase detector output signals have a selected width of zero, and the pulses of said third and fourth phase detector output signals are generated substantially at each flux transition and have a selected width equal to twice the width of the clocking signal pulses.

7. The aparatus of claim 6 including:

an operational amplifier for controlling said clocking voltage based upon the output of said phase detector having, as input currents, a D.C. bias current and a tuning current determined by the pulse widths of said first, second, third and fourth phase detector output signals.

8. The apparatus of claim 1 wherein: apparatus for generating said clocking signal having a clocking frequency dependent upon said clocking voltage includes at least one voltage controlled oscillator.

9. The apparatus of claim 8 including:

two voltage controlled oscillators, each for generating a clocking signal related to at least one of a plurality of distinct magnetic tape speeds, and a selector network responsive to a particular tape speed for supplying clocking voltage to the voltage controlled oscillator related to the particular tape speed.

10. In receiving an electronic data preamble signal and processing said signal according to a clocking signal dependent upon a clocking voltage, a method of establishing and maintaining synchronization of said data preamble and clocking signals including the steps of:

generating a preamble input active during the data preamble signal;

generating first and second data input derived from said data preamble and clocking signals;

generating first and second timing inputs derived solely from said clocking signal;

providing said preamble, first data and first timing inputs to coincidence circuitry adapted to generate a first phase detector output having pulses of a width dependent upon the length of time during which said preamble, first data and first timing inputs are simultaneously high;

providing said second data, second timing and preamble inputs to coincidence circuitry adapted to generate a second phase detector output having pulses of a width dependent upon the length of time during which said preamble, second data and second timing inputs are simultaneously high; and generating a clocking voltage dependent upon the phase detector outputs of said circuitry, whereby changes in the pulse widths of said first and second phase detector outputs tend to alter the clocking voltage.

11. The method of claim 10 wherein:

said phase detector output pulses each have a selected width when said clocking and data preamble signals are synchronized;

a condition other than synchronization causing at least one of said phase detector output signals to have a pulse width other than its selected width thereby to alter the clocking voltage, changing the frequency of the clocking signal thereby tending to synchronize it with said data preamble signal.

12. The method of claim 10 further including:

deriving third and fourth timing inputs from said clocking signal;

providing said first data, third timing and fourth timing inputs to reactive circuitry adapted to generate a third phase detector output having pulses of a width dependent upon the length of time during which said first data and third timing inputs are simultaneously high, and to generate a fourth phase detector output having pulses of a width dependent upon the length of time during which said first data and fourth timing inputs are simultaneously high.

* * * * *